United States Patent
Harris et al.

[11] Patent Number: 5,849,620
[45] Date of Patent: Dec. 15, 1998

[54] METHOD FOR PRODUCING A SEMICONDUCTOR DEVICE COMPRISING AN IMPLANTATION STEP

[75] Inventors: Christopher Harris, Sollentuna; Kurt Rottner, Kista, both of Sweden

[73] Assignee: ABB Research Ltd., Zurich, Switzerland

[21] Appl. No.: 544,979

[22] Filed: Oct. 30, 1995

[51] Int. Cl.⁶ .................................................. H01L 21/265
[52] U.S. Cl. ........................................... 438/273; 438/285
[58] Field of Search ................................ 437/22, 40 DM, 437/247, 100, 984, 987, 41 DM; 257/77; 438/268, 273, 285, 931; 198/DIG. 148

[56] References Cited

U.S. PATENT DOCUMENTS

| | | |
|---|---|---|
| 3,629,011 | 12/1971 | Tohi et al. . |
| 3,999,206 | 12/1976 | Babenko et al. . |
| 4,030,942 | 6/1977 | Keenan et al. . |
| 4,058,413 | 11/1977 | Welch et al. . |
| 4,173,063 | 11/1979 | Kniepkamp et al. . |
| 5,184,199 | 2/1993 | Fujii et al. ............................ 257/200 |
| 5,384,270 | 1/1995 | Ueno . |
| 5,523,257 | 6/1996 | Yamazaki et al. ..................... 438/166 |

FOREIGN PATENT DOCUMENTS

| | | |
|---|---|---|
| 0 697 714 | 8/1996 | European Pat. Off. . |
| 221 598 | 4/1985 | Germany . |
| 58-112372 | 7/1983 | Japan . |
| 63-158836 | 7/1988 | Japan ...................................... 437/22 |
| 96/32743 | 10/1996 | WIPO . |

OTHER PUBLICATIONS

Pan et al., Self–Aligned 6H–SiC MOSFETs with Improved Current Drive, Electronic Letters 6th Jul. 1995, vol. 31, No. 14.

Noreika et al., Structural, Optical, and Dielectric Properties of Reactively Sputtered Films in the System A1N–BN, Journal of Vacuum Science & Technology, Jun. 1969, pp. 722–726.

*Primary Examiner*—John Niebling
*Assistant Examiner*—S. Mulpuri
*Attorney, Agent, or Firm*—Pollock, Vande Sande & Priddy

[57] ABSTRACT

A method for producing a semiconductor device having a semiconductor layer of SiC is disclosed. The method comprises the steps of applying an insulation layer on the semiconductor layer, implanting first impurity dopant into the semiconductor layer, and annealing this layer at at least about 1500° C. so that the implanted first impurity dopant is activated, wherein the insulating layer comprises AlN as a major component and the insulating layer is applied before the annealing step and maintained on the semiconductor layer during the annealing step.

18 Claims, 2 Drawing Sheets

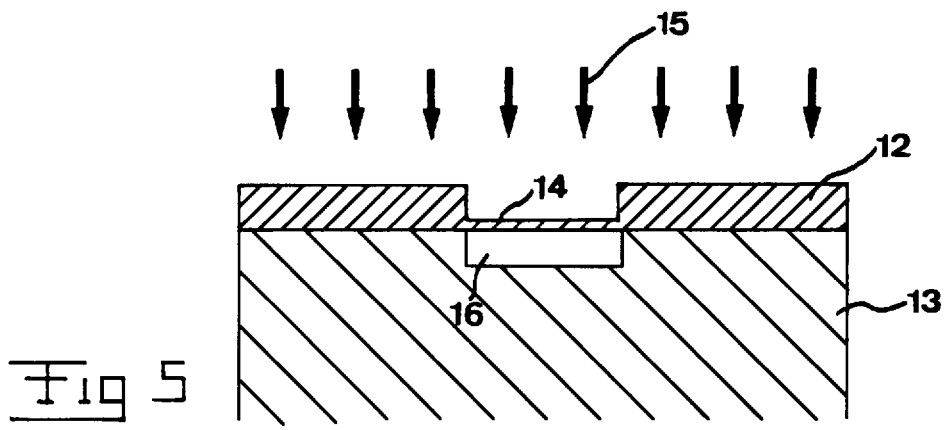
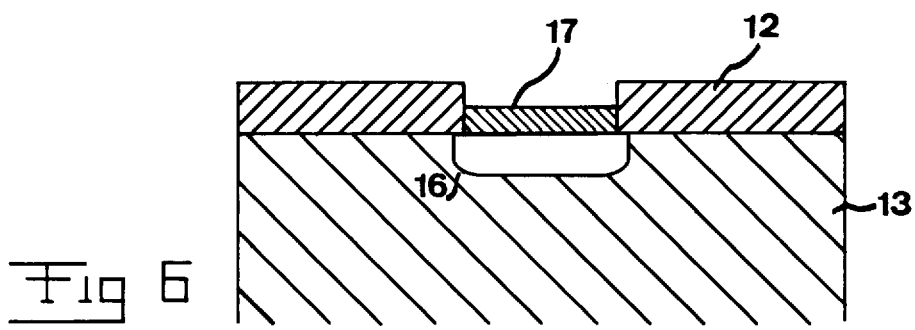

METHOD FOR PRODUCING A SEMICONDUCTOR DEVICE COMPRISING AN IMPLANTATION STEP

TECHNICAL FIELD

The present invention relates to a method for producing a semiconductor device having a semiconductor layer of SiC, this method comprising at least the steps of applying an insulating layer on the semiconductor layer, implantation of an impurity dopant into the semiconductor layer and annealing this layer at such a high temperature that the implanted impurities are activated, the insulating layer being applied before and maintained on the semiconductor layer during the annealing step.

BACKGROUND OF THE INVENTION

Such method relates to production of all types of semiconductor devices, such as for example different types of diodes, transistors and thyristors.

Such devices are particularly used in applications in which it is possible to benefit from the superior properties of SiC especially in comparison with Si, namely the capability of SiC to function well under extreme conditions. SiC has a high thermal stability due to a large band gap energy, such that devices fabricated from SiC material are able to operate at high temperatures, namely up to 1000° K. Furthermore, it has a high thermal conductivity, so that SiC-devices can dissipate a high power without overheating. SiC also has a more than five times higher breakdown field than Si, so that it is well suited as a material in high power devices operating under conditions where high voltages may occur in the blocking state of a device.

However, this extreme chemical and physical stability of the SiC necessitates an annealing after the implantation at comparatively high temperatures, mostly above 1500° C. and often above 1700° C., for activating implanted impurities. This makes it impossible to leave the insulating layer on the semiconductor layer during this heat treatment which would occur when traditional insulating materials, such as $SiO_2$, are used.

One type of method according to the introduction is known from U.S. Pat. No. 5,384,270. This patent describes a method of producing a silicon carbide MOSFET using a so called self alignment technique, i.e. the implantation of impurity dopants into the semiconductor layer of SiC is made while using layers comprising the device itself, here the gate electrode, as a mask for the ion implantation. Accordingly, the insulating layer has to be there before the ion implantation and will also be there during the following annealing step. In this case $SiO_2$ is accordingly used as insulating layer and the annealing temperature required for efficient activation after an implantation will damage the insulating layer, so that a semiconductor device produced in the way described in this U.S. patent will not have an appropriate function, especially the insulating properties will be degraded and the conductivity in the inversion channel will be reduced.

The same problem exists in all types of methods in which an implantation step is carried out and it is desired or absolutely necessary that an insulating layer remains on the SiC-layer during the annealing step, for instance for being left on the device for passivation purposes.

SUMMARY OF THE INVENTION

The object of the present invention is to provide a method according to the introduction, which makes it possible to produce semiconductor devices having a semiconductor layer of SiC by using ion implantation while solving the problems discussed above.

This object is in accordance with the invention obtained by applying a material having AlN as major component on the semiconductor layer as the insulating layer. AlN can be made stable at least up to 2000° K. and thus well capable of withstanding the high temperature activation anneal following the implantation step, so that the insulating layer will not be destroyed by the annealing process. Furthermore, AlN has a very good lattice match with SiC with a misfit of only 0,7% and it has nearly the same coefficient of thermal expansion as SiC. Thus, it will be possible to grow an insulating layer having AlN as a major component with a high quality on the SiC semiconductor layer, and this insulating layer will not be negatively affected by the high annealing temperatures required for activating impurities implanted in SiC. The expression "as major component" means that it will be possible to add some other components to AlN for forming the insulating layer, such as small amounts of other Group III B-nitrides should this be desired, but such additions will decrease the lattice match with SiC. The use of a material having AlN as major component as an insulating layer in a method for producing a semiconductor device of this type has many advantages, which will appear from the discussion of preferred embodiments of the invention following below, wherein the insulating layer may be used for utilizing the self aligned technology for isolated gate devices, as a mask for the implantation and be left on the device as a passivation layer and so on.

According to a preferred embodiment of the invention the method comprises at least a step of self aligned implantation, and the insulating layer is present during this step. Thus, it will be possible to use such a layer having AlN as major component as the insulating dielectric for the production of isolated gate devices, since the insulating layer is not degraded by the activation anneal, so that this very advantageous technique for the production of semiconductor devices may be used also for the production of isolated gate devices with a semiconductor layer of SiC. This technique is very advantageous with respect to other production techniques, since one does not need any realignment between the different steps. Another advantage of this technique is that the correct alignment obtained thereby enables the reduction of parasitic losses due to limits otherwise placed in the device structure, for example capacitances resulting from overlaps.

According to another preferred embodiment of the invention a gate material, such as a suitable refractory metal, for example Ta, layer for the semiconductor device is applied on the insulating layer before the step of self aligned implantation, the gate material layer leaving at least one opening for the penetration of the implanted impurity dopant into the semiconductor layer during the step of self aligned implantation for making the implanted region in the semiconductor layer aligned with the opening. This method has the advantages discussed above, and it may for instance be used for the production of isolated gates semiconductor devices with an insulating layer still having an excellent quality after the high temperature anneal for activating the impurity dopant implanted in the SiC-layer.

According to another preferred embodiment of the invention the method comprises a step of implantation of a P-type impurity dopant, and the insulating layer is present during the activation annealing after this implantation. It is very advantageous to introduce acceptors as impurity dopants by the implantation technique, since these acceptors need a higher annealing temperature for activation than the donors, so that this case is particularly troublesome with known insulating materials, but the thermal stability of AlN allows these high temperatures.

According to a further preferred embodiment of the invention the insulating layer is used as a mask for implantation to prevent the areas of the semiconductor layer located therebehind from being reached by the implanted impurities. The use of an insulating layer having AlN as major component as an implantation mask is very advantageous, since AlN is a radiation hard material. As a result it is only damaged on the surface due to a high resistance to implantation and the ions so implanted in the surface layer thereof will not diffuse through the mask to the interface with the semiconductor layer during the annealing step. Thus, high implantation energies are required for implantation in SiC and the use of AlN as an implantation mask makes it possible to design such a mask with a reasonable thickness, whereas other materials, such as $SiO_2$, when used as mask material, have to be much thicker. A layer having AlN as a major component can therefore be used as an implantation mask enabling structures to be defined in a non-mesa planar technology, for example implanted p-n diodes, field rings etc. The mask layer will remain intact as a means of device isolation (passivation).

According to a preferred development of the embodiment of the invention described above and including the application of a gate material layer, the gate is made of a refractory metal, and preferably TiN. This refractory metal permits to use the self aligned technology for producing isolated gate devices having a semiconductor layer of SiC, since it will not be damaged by the high annealing temperatures needed for activation of the impurities implanted. Furthermore, the gate of TiN and the insulating layer, when it is made of AlN, may be grown in one single growth run facilitating the production of the semiconductor device.

According to another preferred embodiment of the invention the insulating layer is applied on the semiconductor layer at a thickness allowing implantation therethrough but adapted to prevent out-diffusion of the dopants and Si-evaporation from the SiC surface during the annealing step. Selecting such a thickness of the insulating layer allows implantation into the SiC-layer therebehind while at the same time taking advantage of the low diffusivity in AlN to prevent out-diffusion and Si-evaporation during the high temperature annealing step.

The invention also comprises use of a material having AlN as major component in a semiconductor device having a semiconductor layer of SiC, the device being created by a method comprising ion implantation and annealing at high temperatures for activating the implant in the presence of the material, as well as a semiconductor device produced by carrying out a method comprising the characteristics according to any of the appended method claims. The advantages of this use and such a semiconductor device has been discussed above. Such a device will of course be most suitable for high power applications thanks to the physical characteristics of SiC and AlN.

Further advantages and preferred features of the invention will appear from the following description and the other dependent claims.

BRIEF DESCRIPTION OF THE DRAWINGS

With reference to the appended drawings, below follows a specific description of preferred embodiments of the invention cited as examples.

In the drawings:

FIG. 5–6 illustrate schematically two of the steps of a method for producing a semiconductor power device in the form of a rectifier diode of SiC according to a second preferred embodiment of the invention.

DETAILED DESCRIPTION OF PREFERRED EMBODIMENTS

Figure 1:
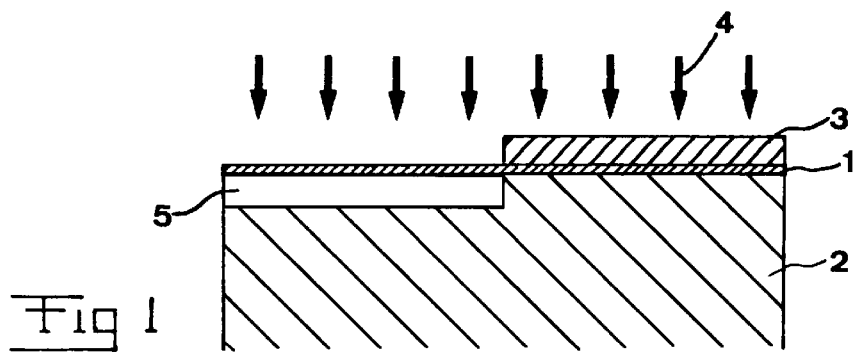
FIG. 1–4 illustrate schematically different steps of a method for producing a semiconductor power device in the form of an isolated gate device of SiC according to a first preferred embodiment of the invention.

FIG. 1–4 illustrate a few important steps of a large number of steps in a method according to the invention for producing an isolated gate device made of SiC for a high power application by using the implantation technique and in one step the self alignment technique. A thin insulating layer 1 of AlN has been epitaxially grown onto a low doped N-type semiconductor layer 2 of SiC, and a mask 3 is applied onto an area of the insulating layer 1 to prevent the areas of the semiconductor layer located therebehind from being reached by the impurities implanted in an ion implantation step described below. The insulating layer 1 may have a thickness of about 500 Å allowing implantation therethrough. The donor concentration in the low doped layer 2 will typically be about $10^{15}$ cm$^{-3}$. The crystal is exposed to a bombardment of ions having a kinetic energy of several hundred keV or more, for instance 300 keV, for implanting impurities of P-type into the semiconductor layer 2. These high energies are needed as a consequence of the physical properties of SiC, and a kinetic energy of 300 keV may for instance result in a penetration depth of less than 1 $\mu$m in the SiC-layer. The impurities may for instance be B or Al. The implantation process is indicated by the arrows 4. In this way a doped P-type layer 5 will be formed in the SiC crystal in the area not covered by the mask 3.

Figure 2:
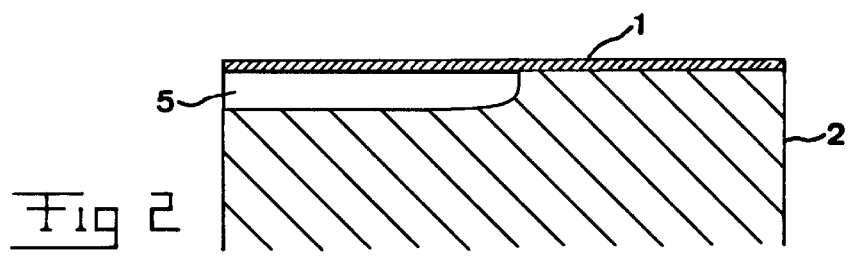
Figure 3:
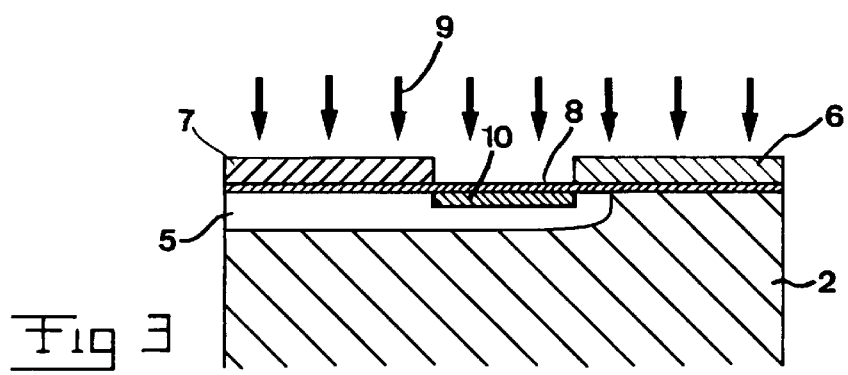
Figure 4:
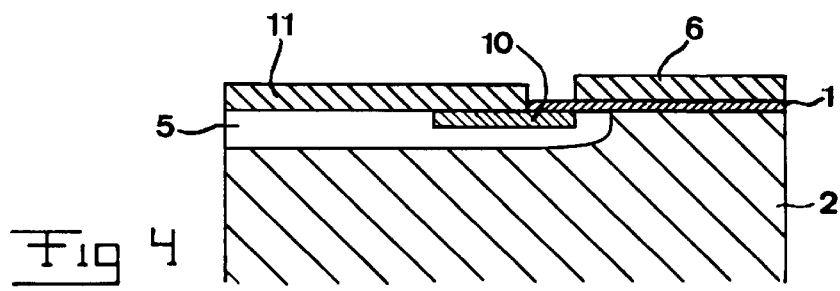

After that mask 3 is removed, for instance by Reactive Ion Etching (RIE), and the crystal is heated to a temperature exceeding 1700° C. for activating the acceptors implanted in the P-type layer 5. The insulating layer 1 of AlN is well capable of withstanding these high temperature activation anneal and will also prevent out-diffusion of the dopants and Si-evaporation from the SiC-surface during the annealing step. FIG. 2 shows the crystal after the annealing step. After that a gate electrode material 6 is applied on a part of the insulating layer 1, and a further mask 7 is applied on another part thereof leaving an opening 8 therebetween for ion implantation. The gate electrode 6 is made of a refractory metal, for instance TiN. An implantation step (see arrows 9) is then carried out for implantation of a N-type impurity dopant in the SiC-layer behind the opening 8. In this way a highly doped, for instance $10^{19}$ cm$^{-3}$, N-type layer 10 is obtained. This layer 10 is aligned with the gate electrode 6, which will remain intact in the semiconductor device, so that this implantation step uses the self alignment technology. Then, mask 7 is removed and the crystal is annealed for activating the donors implanted in the highly doped N-type layer 10. The AlN-layer 1 will have the same function during this annealing step as during the annealing step described above. Following the annealing step a source area covering the implanted N$^+$-layer and also partly the P-layer is etched away and a metal contact layer 11 forming the source is grown.

In this way a semiconductor device having a gate 6 isolated by an isolating layer 1 having a high quality has been produced by using the self aligned technology. The device has a source 11 and a drain not shown connected to the N+ substrate on which the low-doped N-type layer 2 is grown. The current through this device may be controlled by controlling the gate potential.

FIG. 5 and 6 illustrate some steps of another preferred method according to the invention, in which AlN is used as a material for an implantation mask and left after the implantation for passivation purposes. A layer 12 of AlN is grown onto a low-doped N-type SiC crystal 13. In a region of the insulating layer 12 insulating layer material is removed by a suitable technique, so that there will be a thin layer portion 14 having a thickness allowing the penetration of ions therethrough during an implantation step thereafter. Thus, the thickness of this layer portion 14 may be for instance 0,05 μm, whereas the thickness of the rest of the layer 12 may be for instance 1 μm, which will be enough to prevent implantation ions from reaching the interface between the layer 12 and the SiC semiconductor layer 13. It may be mentioned that a layer of AlN having a thickness of 1,28 μm will be required to prevent boron having a kinetic energy of 1 MeV from penetrating to the interface, and boron is the P-type impurity that penetrates most deeply into a layer of AlN. Thus, a mask made of AlN or having AlN as major component may be made comparatively thin due to the radiation hardness of AlN. After that the crystal is bombarded by a P-type impurity (see arrows 15), for instance Al or B, and these impurities will penetrate through the thin layer portion 14 but not through the layer 12 forming an implantation mask. Thus, a P-type doped region 16 is formed below or behind the layer portion 14. After that the crystal is annealed at a temperature above 1700° C. for activating the acceptors in the region 16. During this anneal the thin layer portion 14 prevents out-diffusion of dopants from the region 16, and the layer 12 will not in any way be harmed by the high temperatures, due to the physical properties of AlN. After said activation annealing the layer portion 14 is removed by for instance reactive ion etching, and an ohmic contact 17 applied in the opening so formed in the insulating layer 12. The insulating layer 12 is then left as a passivation layer of the rectifier diode so created.

Accordingly, an insulating layer of AlN or of a material having AlN as major component makes it possible to use the ion implantation technique for producing semiconductor devices of SiC when it is a requirement or a desire to have the insulating layer present during the high temperature annealing for activating the impurity dopant implanted.

The invention is of course not in any way restricted to the preferred embodiments described above, but many possibilities of modifications thereof will be apparent to a worker with ordinary skill in the art.

As mentioned in the introduction the invention is applicable to all types of semiconductor devices, preferably semiconductor devices adapted to operate under extreme conditions, such as high voltages and the generation of large amounts of heat, while taking advantage of the physical properties of SiC.

The invention not only covers methods for producing SiC semiconductor devices according to the two embodiments described above, but also every production method in which an implantation and after that an annealing takes place in the presence of an insulating layer.

The invention also comprises methods in which N-type impurity dopants, such as N and P, are implanted and a high temperature activating annealing is used thereafter.

All definitions concerning the materials of the different device layers do of course also include inevitable impurities as well as intentional doping when SiC is concerned.

The definition layer is to be interpreted broadly and comprise all types of volume extensions and shapes.

We claim:

1. A method for producing a semiconductor device having a semiconductor layer of SiC, said method comprising the steps of:

applying an insulation layer on said semiconductor layer, implanting first impurity dopant into said semiconductor layer, annealing said semiconductor layer at at least about 1500° C. so that the implanted first impurity dopant is activated, and applying a gate electrode of refractory metal on said insulating layer before any self-aligned implantation, wherein said insulating layer comprises AlN as a major component and said insulating layer is applied before said annealing step and maintained on said semiconductor layer during said annealing step.

2. A method according to claim 1, wherein said insulating layer consists of AlN.

3. A method according to claim 1 further comprising a step of self aligned implantation wherein said insulating layer is present during this step.

4. A method according to claim 3, wherein said gate material layer leaves at least an opening for the penetration of the implanted impurity dopant, having opposite conductivity type to that of first impurity dopant into said semiconductor layer during said step of self aligned implantation for making the implanted region in said semiconductor layer aligned with said opening.

5. A method according to claim 4, wherein said method is used for producing isolated gate semiconductor devices.

6. A method according to claim 1, wherein said method is used for producing a MISFET.

7. A method according to claim 6, further comprising the steps of:

implanting an impurity dopant of P-type into a first region of a low doped N-type SiC-layer which is not covered by a mask blocking penetration of implanted ions, said SiC-layer being covered by a thin insulating layer of a material having AlN as major component, annealing said SiC-layer for activating said implanted impurities, applying a gate material layer onto said insulating layer after removal of said mask while leaving an opening above a part of said P-type region, implanting an impurity dopant of N-type into a self aligned region of said P-type region for forming a N-type region surrounded by said P-type region and annealing the SiC-layer for activating the impurities implanted in said self aligned N-type region.

8. A method according to claim 1, wherein said annealing step is carried out at above 1700° C.

9. A method according to claim 1, further comprising a step of implanting a P-type impurity dopant, and wherein said insulating layer is present during the activation annealing after this implantation.

10. A method according to claim 3, further comprising a step of self-aliqned implantation of a N-type impurity dopant, wherein said insulating layer is present during the activation annealing after this implantation.

11. A method according to claim 1, wherein said insulating layer is used as a mask for implantation for preventing areas of said semiconductor layer located therebehind from being reached by the impurities implanted.

12. A method according to claim 1, wherein said insulating layer is left on said semiconductor device as a passivation layer.

13. A method according to claim 4, wherein said gate is made of a refractory metal.

14. A method according to claim 13, wherein said gate is made of TiN.

15. A method according to claim 14, wherein said gate and said insulating layer are grown in one single step.

16. A method according to claim 1, wherein said insulating layer is applied on said semiconductor layer at a thickness allowing implantation therethrough but adapted to prevent out-diffusion of the dopants and Si-evaporation from the SiC surface during said annealing step.

17. A method according to claim 1, used for producing high power devices.

18. A method according to claim 8, wherein said P-type impurity dopant is one of B and Al.

* * * * *